United States Patent [19]
Yamagata et al.

[11] Patent Number: 5,208,474
[45] Date of Patent: May 4, 1993

[54] INPUT CIRCUIT OF A SEMICONDUCTOR DEVICE

[75] Inventors: Tadato Yamagata; Hiroshi Miyamoto; Michihiro Yamada, all of Hyogo, Japan

[73] Assignee: Mitsubishi Denki Kabushiki Denki, Tokyo, Japan

[21] Appl. No.: 646,544

[22] Filed: Jan. 28, 1991

[30] Foreign Application Priority Data

Feb. 7, 1990 [JP] Japan .................. 2-29141

[51] Int. Cl.$^5$ .......................................... H01L 29/06
[52] U.S. Cl. .................. 257/356; 257/360; 257/546
[58] Field of Search ............. 357/41, 40, 23.13, 13, 357/42; 361/90, 92

[56] References Cited

U.S. PATENT DOCUMENTS

| 4,616,243 | 10/1986 | Minato et al. | 357/23.13 |
| 4,868,705 | 9/1989 | Shiochi et al. | 357/23.13 |
| 4,881,113 | 11/1989 | Momodomi et al. | 357/23.13 |
| 4,922,371 | 5/1990 | Gray et al. | 357/23.13 |
| 4,980,746 | 12/1990 | Harrington III | 357/41 |
| 4,996,626 | 2/1991 | Say | 357/23.13 |
| 5,079,613 | 1/1992 | Sawada et al. | 357/42 |
| 5,097,310 | 3/1992 | Eimori et al. | 357/42 |

FOREIGN PATENT DOCUMENTS

| 58-14573 | 1/1983 | Japan | 357/23.13 |
| 60-48906 | 10/1985 | Japan | |
| 63-65665 | 3/1988 | Japan | 357/23.13 |

OTHER PUBLICATIONS

Yamagata, et al., "The Effect of the Undershoot of the Input Signal in Dynamic RAM", LSI Research and Development Laboratory, Mitsubishi Electric Corporation (1989).

Primary Examiner—Jerome Jackson, Jr.
Assistant Examiner—Courtney A. Bowers
Attorney, Agent, or Firm—Lowe, Price, LeBlanc & Becker

[57] ABSTRACT

An input circuit of a semiconductor device includes a P type well formed on the main surface of a semiconductor substrate, and an N type region formed on the main surface in the P type well. A P-N junction is formed by the N type region and the P type well. An input voltage is applied to the N type region, which input voltage is applied to an internal circuit formed on the semiconductor substrate. When the P-N junction is rendered conductive by an application of an excessive voltage to the input voltage, the current caused by the excessive voltage is absorbed to the supply potential through the P type region formed in the P well.

9 Claims, 8 Drawing Sheets

INPUT CIRCUIT OF A SEMICONDUCTOR DEVICE

BACKGROUND OF THE INVENTION

1. Field of the Invention

The present invention relates to an input circuit of a semiconductor device and, more specifically, to an input circuit whose inner circuitry is free from the influence of surge voltage of input signals.

2. Description of the Background Art

FIG. 10 is a schematic block diagram of a semiconductor device to which the present invention is applied. Referring to FIG. 10, a semiconductor integrated circuit device 31 to which the present invention is applied receives external signals at external input terminals 32 and the signals are transmitted to the internal circuitry through input protecting circuits 33. As shown in FIG. 10, generally, circuits called input protecting circuits 33 are provided between the external input terminals 32 and the internal circuit so as to prevent breakdown of the internal circuit caused by a surge voltage from the external input terminals 32, in the semiconductor integrated circuit device 31.

The present invention is to prevent problems caused by introduction of electrons or the like at portions where the input signal is connected to the substrate through a diffusion layer and a well layer when a surge voltage such as undershoot is applied to the external input terminal 32, and the present invention is not particularly related to the input protecting circuit 33 shown in FIG. 10. The details of the input circuit is disclosed in, for example, U.S. Pat. No. 4,692,781 entitled "Semiconductor Device With Electrostatic Discharge Protection".

Problems caused by the undershoot, for example, on the semiconductor device will be described in the following with reference to FIG. 11. FIG. 11 is a schematic diagram of a DRAM as an example of the semiconductor device. Referring to FIG. 11, the dynamic RAM (hereinafter referred to as a DRAM) comprises an input circuit 40 and a plurality of memory cells 43. The input circuit 40 comprises an N+ diffusion layer 47 and an input terminal 46 connected to the N+ diffusion layer 47. The memory cell 43 comprises an NMOS transistor 44 and a capacitor 45. The N+ diffusion layer 47 is connected to the input terminal 46. Further, the N+ diffusion layer 47 forms a part of the NMOS transistor 42 for discharging, when a high voltage is applied, the high voltage.

In the DRAM having such a structure, an undershoot of an input signal, for example, significantly affects the memory cell characteristics. For example, referring to FIG. 11, if an undershoot of the input signal is supplied as an input through the input terminal 46, electrons, which are minority carriers, are introduced to the P type semiconductor substrate 41 as shown by the dotted line in the figure. The electrons reach the memory cell 43 to destroy charges representing information stored in the memory cell 43. If the memory cell 43 and the input circuit 40 are adjacent to each other, the introduced electrons easily reach the memory cell 43 to incur this phenomenon. In order to prevent such a phenomenon, the distance between the memory cell 43 and the input circuit 40 is made sufficiently long, and generally, a substrate voltage generating circuit is provided on the semiconductor substrate 41 to apply a negative voltage $V_{BB}$ to the substrate.

FIG. 12 shows one example of a conventional input circuit. Referring to FIG. 12, the conventional input circuit 40 comprises a P type semiconductor substrate 1, a P well 2 formed on a main surface of the P type semiconductor substrate 1 and an N well 3 formed adjacent to the P well 2. On the main surface of the P well 2, an N+ diffusion layer 8 and an NMOS transistor 5 adjacent to the N+ diffusion layer 8 and connected to the ground potential are formed. An input terminal 7 is connected to the N+ diffusion layer 8, and an input resistance 6 exists in an interconnecting layer therebetween. An input signal is transmitted from the interconnecting layer connecting the input terminal 7 and the N+ diffusion layer 8 to the internal circuit. In the conventional input circuit 40, a parasitic bipolar transistor 4 is formed by the N+ diffusion layer 9, the P well 2 and the N+ diffusion layer 8. A negative voltage $V_{BB}$ is applied by the substrate voltage generating circuit to the P type semiconductor substrate 1. Generally, the substrate potential $V_{BB}$ is about $-3$ V.

The operation of the conventional input circuit 40 will be described. An external input signal is applied through the input terminal 7 and transmitted to the internal circuit through the input resistance 6 as well as to the N+ diffusion layer 8. The NMOS transistor 5 has a very thick gate oxide film, and the gate potential is 0 V, and therefore it is normally off. However, when a high electrostatic pulse is applied to the input terminal and a high voltage is applied to the N+ diffusion layer 8, a punch through phenomenon occurs in the NMOS transistor 5 so that the transistor is turned ON, whereby the high voltage is discharged to the ground potential and gate breakdown or the like is prevented in the internal circuit. When an overshoot is applied to the N+ diffusion layer 8, the P-N junction between the N+ diffusion layer 8 and the P well 2 is reversely biased, so that electrons are not introduced to the semiconductor substrate 1.

When an undershoot is applied to the N+ diffusion layer 8, introduction of electrons to the substrate 1 can be prevented until the undershoot reaches $-(|V_{BB}|+V_D)$ V where diffusion potential of the P-N junction is represented as $V_D$, since the P-N junction between the N+ diffusion layer 8 and the P well 2 is reversely biased, as the negative voltage $V_{BB}$ is applied to the substrate 1. For example, if $V_D=0.8$ V and $V_{BB}=-3$ V, introduction of electrons to the substrate can be prevented when the undershoot is up to about $-3.8$ V. However, if a plurality of DRAMs are mounted on a board and they are to be operated in the system, an undershoot exceeding this value may be applied to the DRAMs. In such a case, a forward direction voltage is biased to the P-N junction between the above mentioned N+ diffusion layer 8 and the P well 2. Consequently, electrons are introduced to the substrate, which may destroy the information stored in the memory cell. In addition, introduction of the electrons to the substrate also affects the substrate potential itself, which may affect refresh characteristic which is an important characteristic of the DRAM, degrade soft error rate, and cause fluctuation of transistor characteristics such as the threshold value $V_{TH}$ of the memory transistor, current supplying capability $\beta$ of the memory transistor, and so on. Therefore, in the conventional input circuit, not only is a negative voltage $V_{BB}$ applied to the substrate but the parasitic bipolar transistor 4 is utilized to prevent introduction of electrons to the substrate. More specifically, referring to FIG. 12, a region formed of an N+ diffusion layer 9 and an N well 3 is formed, and the potential of this region is fixed to the supply voltage $V_{CC}$. By providing such a region, a parasitic bipolar NPN transistor 4 is formed between the N+ diffusion layer 9, the N well 3, the P well 2 and the N+ diffusion layer 8. An equivalent circuit thereof is shown in FIG. 13.

Referring to FIG. 13, the operation of the parasitic bipolar NPN transistor 4 will be described. If an undershoot whose absolute value is smaller than $(|V_{BB}|+V_D)$ V is applied to the N+ diffusion layer 8, the parasitic bipolar transistor 4 is OFF. However, if an undershoot whose absolute value exceeds $(|V_{BB}|+V_D)$ V is applied, the parasitic bipolar transistor 4 is turned ON. In principle, the electrons introduced from the N+ diffusion layer 8 hardly flow to the substrate, but flow to the supply voltage $V_{CC}$ through the N+ diffusion layer 9. However, actually, the parasitic bipolar transistor 4 has wide base, so that part of the electrons introduced from the N+ diffusion layer 8 flow to the substrate 1.

FIG. 14 is a timing chart showing relation between an undershoot of the input signal described above and the current flow to the substrate 1 at that time. Reference numeral (1) of FIG. 14 represents voltage of the input signal applied to the external input terminal 7, (2) represents current flowing through the P-N junction portion, and (3) represents current flowing through the substrate 1. If an undershoot of the input signal occurs from the time $t_0$ and the value thereof exceeds a prescribed value, a current as shown in the figure flows through the P-N junction and the current as shown in the figure flows to the substrate 1 (from $t_1$ to $t_2$).

Consequently, in the conventional input circuit, destruction of information stored in the memory cells, degradation of refresh characteristic and soft error rate caused by fluctuation of the substrate voltage, malfunctions caused by fluctuation of transistor characteristics derived from fluctuation of the substrate voltage and so on caused by electrons introduced by an undershoot or an overshoot of the input circuit can not be perfectly prevented, and the operation of the internal circuit in the semiconductor device is unstable.

SUMMARY OF THE INVENTION

Therefore, an object of the present invention is to stabilize operation of the internal circuit in an input circuit of a semiconductor device.

Another object of the present invention is to prevent influence of surge voltage of the input signal to the internal circuit of the input circuit of the semiconductor device.

A further object of the present invention is to prevent undesirable flow of current to the substrate caused by conduction of P-N junction in an input circuit of a semiconductor device having a P-N junction.

The above described objects of the present invention can be attained by an input circuit of a semiconductor device, comprising: a semiconductor substrate having a main surface; a first region of a first conductivity type formed on the main surface of the semiconductor substrate; a first region of a second conductivity type different from the first conductivity type, formed on the main surface in the first region of the first conductivity type; wherein a P-N junction is formed by the first region of the second conductivity type and the first region of the first conductivity type, an input voltage applied to the first region of the second conductivity type, the input voltage applied to an internal circuit formed on the semiconductor substrate; and current absorber connected to the second region of the first conductivity type formed on the main surface in a second region of the first conductivity type, for absorbing, when an excessive voltage is applied to the input voltage to render conductive the P-N junction, the current generated by the excessive voltage.

According to the present invention, since the input circuit of the semiconductor device comprises the above described components, the excessive current generated by the conduction of the P-N junction can be absorbed by the current absorbing portion and it is prevented from flowing to the substrate of the semiconductor. Therefore, in a DRAM having an N type memory cell formed on a P type semiconductor substrate, for example, the destruction of the information stored in the memory cell caused by electrons introduced to the substrate at input undershoot, degradation of refresh characteristic or the soft error rate caused by fluctuation of the substrate voltage, and fluctuation of the transistor characteristics can be suppressed. Consequently, an input circuit of a semiconductor device whose internal circuit operates stably can be provided. Preferably, the current absorbing portion comprises a field effect element of the second conductivity type. Since the current absorbing portion is formed by a field effect element, an input circuit of a semiconductor device whose internal circuit operates stably can be provided by a simple structure.

In another aspect of the present invention, in a semiconductor device having a P-N junction formed on a substrate maintained at a prescribed potential, a method of controlling substrate current for preventing undesirable flow of current caused by conduction of the P-N junction comprises the steps of detecting conduction of P-N junction, and absorbing, at the detection of conduction, excessive current generated thereby to a prescribed potential.

Since the method of controlling substrate current in accordance with the present invention comprises the above described steps, the excessive current generated when the P-N junction is rendered conductive is automatically absorbed to a prescribed potential. Consequently, the internal circuit is free from the influence of the surge voltage of the input signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
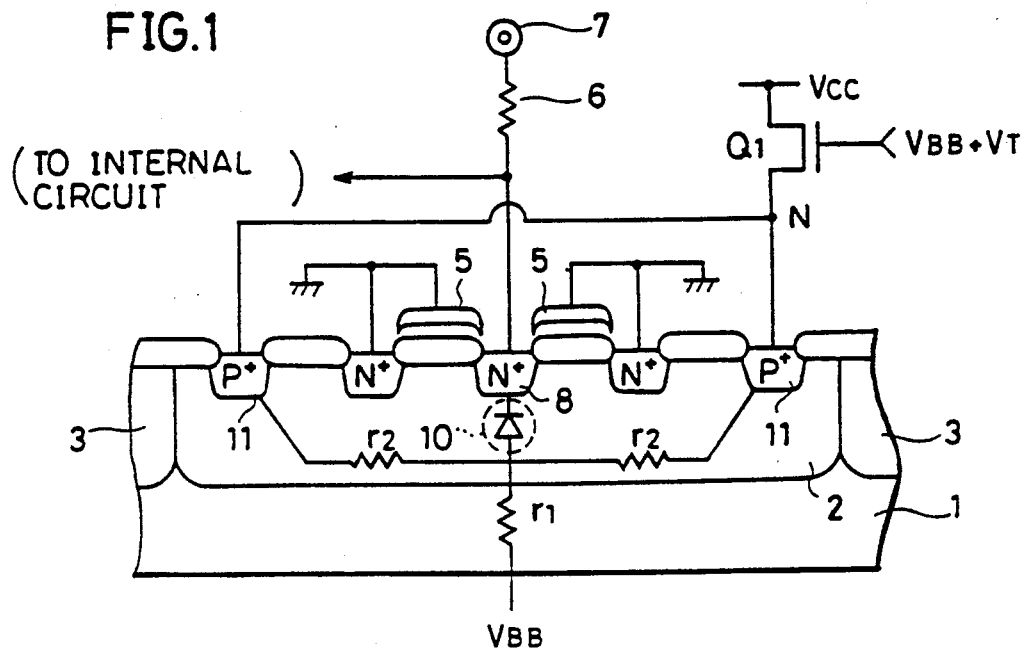
FIG. 1 is a schematic diagram/showing one embodiment of the input circuit of a semiconductor substrate in accordance with the present invention.
Figure 12:
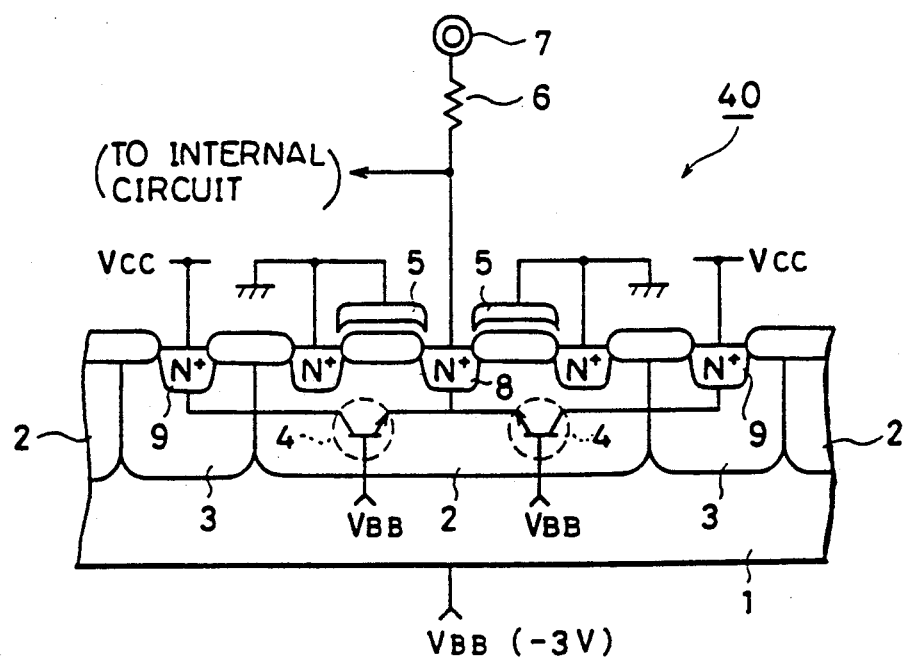
FIG. 12 is a schematic diagram showing a structure of a conventional input circuit.

One embodiment of the present invention will be described in the following with reference to the figures. In the following description, the input circuit of the present invention is applied to a DRAM having a P type substrate and N type memory cells, referring to the prior art (FIG. 12). FIG. 1 is a schematic diagram showing an input circuit of a semiconductor device in accordance with the present invention. Referring to FIG. 1, the input circuit of the semiconductor device in accordance with the present invention comprises a P well 2 formed on a main surface of a P type semiconductor substrate 1, N+ diffusion layers 8 formed on the main surface of the P well 2, and P+ diffusion layers 11 formed spaced apart from the N+ diffusion layers 8. As in the prior art described with reference to FIG. 12, an input terminal 7 is connected to the N+ diffusion layer 8, an input voltage is applied to the internal circuit from a connection portion connecting input terminal 7 and the N+ diffusion layer 8, and the N+ diffusion layer 8 forms a part of the NMOS transistor 5 to discharge a high voltage to the ground potential, when a high voltage is applied to the input terminal 7. In the present invention, an NMOS field effect transistor (hereinafter referred to as NMOSFET) $Q_1$ connected to the power supply $V_{CC}$ and operates in response to a prescribed potential $(V_{BB}+V_D)$ is connected to the P+ diffusion layer 11.

The operation of the input circuit in accordance with the present invention will be described in the following. A negative voltage $V_{BB}$ is applied to the P type semiconductor substrate 1 by a substrate voltage generating circuit included in the device. Consequently, when an input overshoot or an input undershoot whose absolute value is smaller than $(|V_{BB}|+V_T)$ V is applied to the N+ diffusion layer 8, the P-N junction between the N+ diffusion layer 8 and the P well 2 is reversely biased. As in the prior art, as a result, introduction of electrons to the substrate is prevented. Different from the prior art, a region formed of N+ diffusion layer 9 and the N well 3 as in FIG. 12 is not formed, and the P well 2 formed below the N+ diffusion layer 8 which is the node to which the input signal is applied, is connected to the supply voltage $V_{CC}$ through the P+ diffusion layer 11 and the NMOSFET $Q_1$. As will be described later, a potential $(V_{BB}+V_T)$ V is applied to the gate of the NMOSFET $Q_1$ by a $(V_{BB}+V_T)$ generating circuit. The value $V_T$ is determined dependent on the threshold voltage of the transistor constituting the $(V_{BB}+V_T)$ generating circuit. If the threshold voltage of the NMOSFET $Q_1$ is $V_{T1}$, the value $V_T$ is set to be $V_T \leq V_{T1}$. The reason for this is that if $V_T > V_{T1}$, the NMOSFET $Q_1$ is always ON as the potential of the substrate is normally at $V_{BB}$, and therefore a through current flows from the supply potential $V_{CC}$ to the substrate 1 through the NMOSFET $Q_1$.

Figure 2:
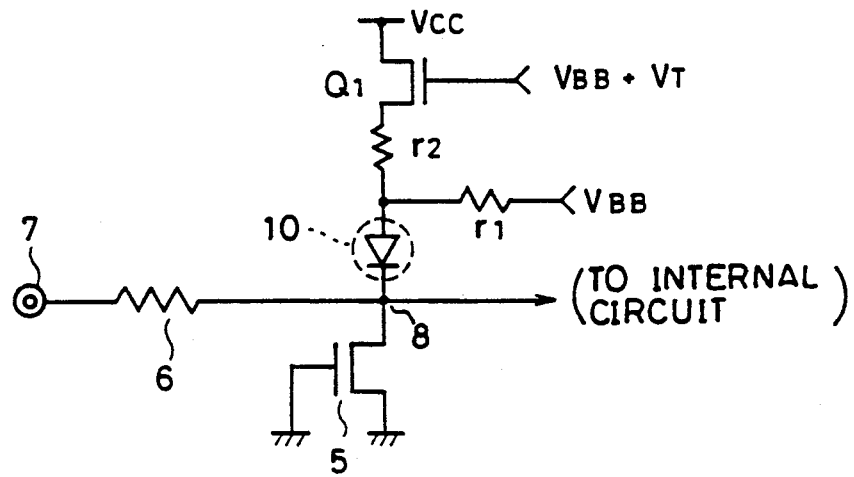
FIG. 2 is an equivalent circuit of the input circuit of the present invention shown in FIG. 1.
Figure 3:
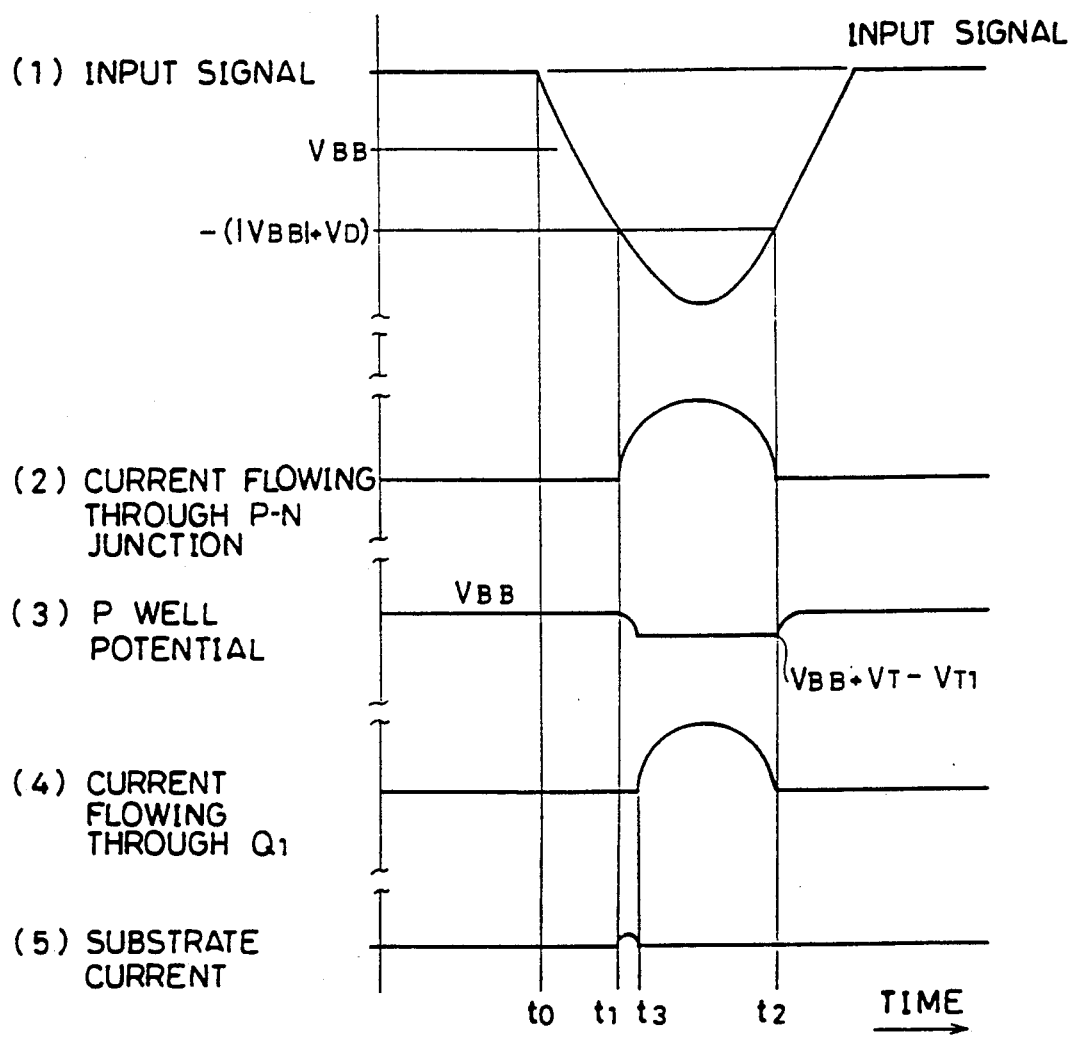
FIG. 3 is a timing chart showing operation of the input circuit in accordance with the present invention.

FIG. 2 is an equivalent circuit diagram of the input circuit in accordance with the present invention shown in FIG. 1. FIG. 3 is a timing chart showing the input signal of the input circuit in accordance with the present invention and potentials and currents at various portions when the input signal is applied. Referring to FIG. 3, (1) represents the input signal, (2) represents current flowing through the P-N junction, (3) represents potential of the P well 2, (4) represents current flowing through the NMOSFET $Q_1$, and (5) represents current flowing through the substrate 1. Referring to FIGS. 2 and 3, the operation of the input circuit in accordance with the present invention will be described in detail.

As described above, the value $V_T$ determined by the threshold voltage of the transistor constituting the $(V_{BB}+V_T)$ generating circuit and the threshold value $V_{T1}$ of the NMOSFET $Q_1$ are set to satisfy $V_T \leq V_{T1}$. Therefore, normally, the potential of the substrate 1 and the potential of the P well 2 are maintained at $V_{BB}$ by the substrate voltage generating circuit, and the NMOSFET $Q_1$ is off (see FIG. 3, (3), (5)). As described above, the operation when the input undershoot whose absolute value is smaller than $(|V_{BB}|+V_D)$ V is applied to N+ diffusion layer 8 is the same as that in the prior art. Now, let us assume that an input undershoot whose absolute value exceeds $(|V_{BB}|+V_D)$ V is applied to the N+ diffusion layer 8. When the absolute value of the input signal exceeds $(|V_{BB}|+V_D)$ V at the time $t_1$ of FIG. 3, the P-N junction diode 10 between the N+ diffusion layer 8 and the P well 2 is biased in the forward direction, so that electrons are introduced from the N+ diffusion layer 8 to the P well 2, lowering the potential of the P well 2. When the potential of the P well 2 becomes lower than $(V_{BB}+V_T-V_{T1})$ at $t_3$, the NMOSFET $Q_1$ is turned ON. Now, if $V_T = V_{T1}$, the NMOSFET $Q_1$ is turned OFF when the potential of the P well 2 becomes lower than $V_{BB}$. Therefore, electrons introduced from the N+ diffusion layer 8 flow to the substrate through a substrate resistance $r_1$ or to the supply voltage $V_{CC}$ through a P well resistance $r_2$ and the NMOSFET $Q_1$. However, generally, the substrate resistance $r_1$ is considerably larger than the P well resistance $r_2$ and conduction resistance of the FET. Therefore, most of the electrons from the N+ diffusion layer 8 are not introduced to the substrate 1 but flow to the supply voltage $V_{CC}$ through the P well 2 and the NMOSFET $Q_1$.

Figure 14:
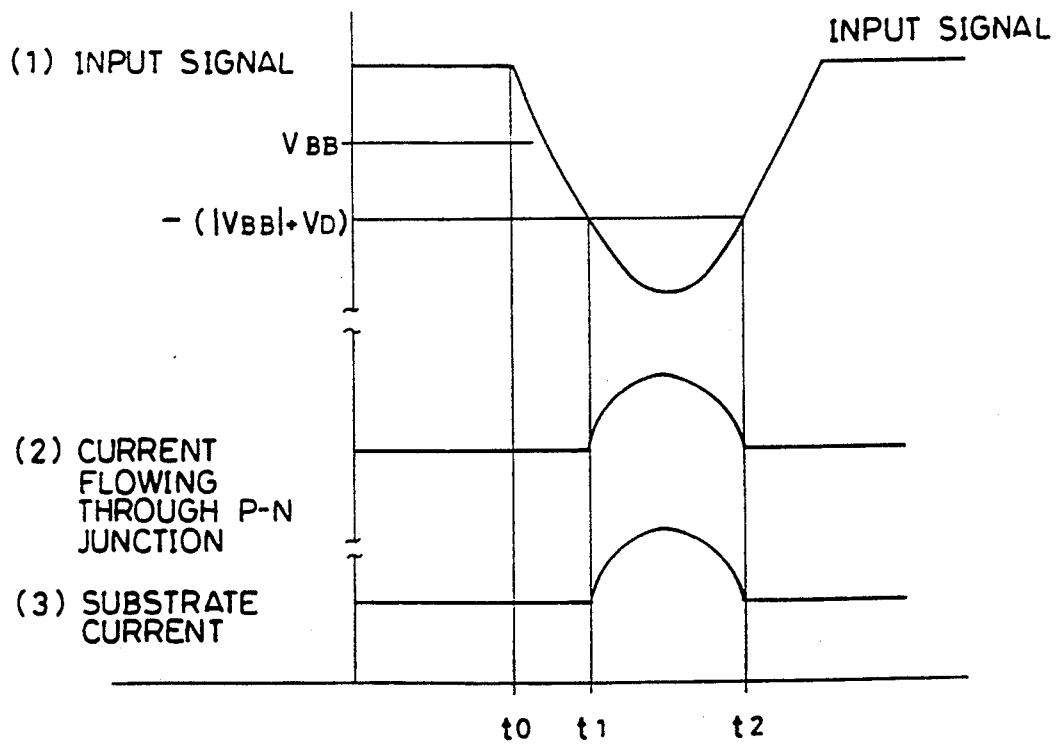
FIG. 14 is a timing chart illustrating the operation of the conventional input circuit.

This state is shown in (5) of FIG. 3. More specifically, in the input circuit in accordance with the present invention, the substrate current flows only from the time $t_1$ when the voltage of the input signal exceeds $(|V_{BB}+V_D|)$ V to $t_3$ when the NMOSFET $Q_1$ is turned on. This value can be neglected, as compared with the substrate current shown in (3) of FIG. 14.

Thus, the input circuit of the present invention can prevent introduction of electrons to the substrate caused by an undershoot of the input signal, and accordingly, the destruction of information stored in the memory cells, degradation of refresh characteristics and soft error rate caused by fluctuation of the substrate voltage, and fluctuation of the transistor characteristics can be much suppressed compared with the prior art.

Figure 4:
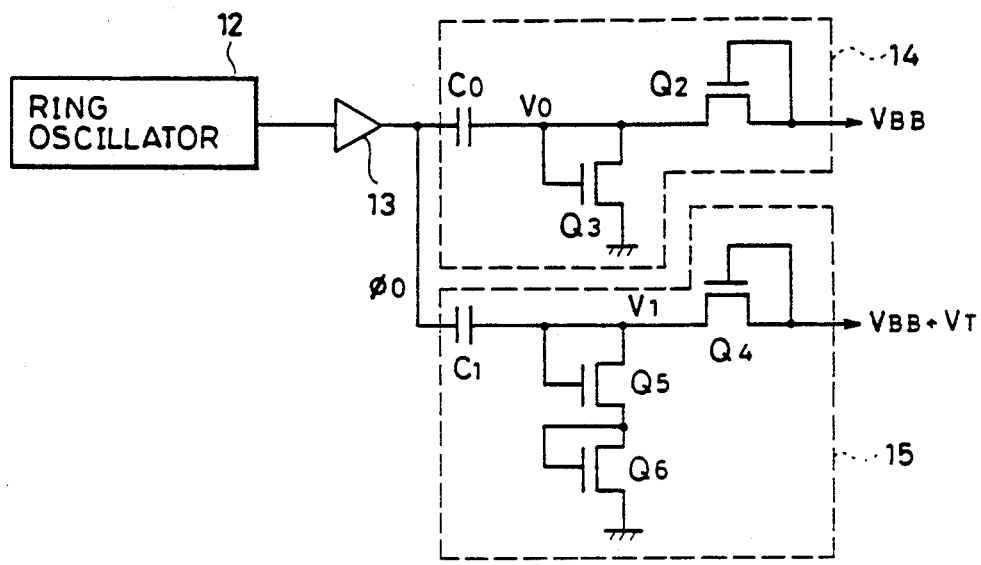
FIG. 4 shows a $V_{BB}$ generating circuit and a $(V_{BB}+V_D)$ generating circuit used in the input circuit of the present invention.

FIG. 4 is a circuit diagram showing examples of the substrate voltage $V_{BB}$ and $(V_{BB}+V_T)$ generating circuits 14 and 15. The $V_{BB}$ generating circuit 14 is a charge pump circuit for generating the substrate voltage $V_{BB}$, which is generally known. The $V_{BB}$ generating circuit 14 comprises a capacitor $C_0$ connected to a driver 13, a transistor $Q_3$ connected to the capacitor $C_0$ and its drain and gate connected to a common node of the capacitor $C_0$ and the transistor $Q_2$, and a transistor $Q_2$ having one electrode and a gate electrode connected to an output terminal and the other electrode connected to the transistor $Q_3$. The $(V_{BB}+V_T)$ generating circuit 15 comprises a capacitor $C_1$ connected to the driver 13, transistors $Q_5$ and $Q_6$ connected in series between the capacitor $C_1$ and the ground potential, and a transistor $Q_4$ connected to the common node of the drain and the gate electrodes of the transistor $Q_5$ and the capacitor $C_1$ and its gate electrode and one electrode connected to the output terminal.

The operation of the $V_{BB}$ generating circuit 14 and of the $(V_{BB}+V_T)$ generating circuit 15 will be described. Both of the circuits have frequencies outputted from the driver 13 and determined by a ring oscillator 12, and are driven by $\phi_0$ which is a pulse signal having the width of $V_{CC}$. When the voltage of the driving signal $\phi_0$ changes from 0 to $V_{CC}$, the voltage of the node $V_0$ shown in FIG. 4 rises from 0 to $V_{CC}$ because of capacitance coupling of the capacitor $C_0$. However, at this time, the transistor $Q_3$ is turned on, and the voltage of the node $V_0$ decreases to $V_{T3}$, where the threshold voltage of the transistor $Q_3$ is $V_{T3}$. Thereafter, when the driving signal $\phi_0$ changes from $V_{CC}$ to 0, the voltage of the node $V_0$ decreases from the above mentioned $V_{T3}$ to $V_{T3}-V_{CC}$ due to the capacitance coupling of the capacitor $C_0$. At this time, although the transistor $Q_3$ is OFF, the transistor $Q_2$ is turned ON, so that the substrate voltage $V_{BB}$ is lowered.

The above described operation is repeated, and the substrate voltage $V_{BB}$ is finally stabilized at $V_{T2}+V_{T3}-V_{CC}$, where the threshold voltage of the transistor $Q_2$ is $V_{T2}$. For example, if $V_{T2}=V_{T3}=1$ V and $V_{CC}=5$ V, then $V_{BB}$ is about $-3$ V.

The $(V_{BB}+V_T)$ generating circuit 15 is a charge pump circuit for generating $(V_{BB}+V_T)$ V, and the basic operation is the same as the above, described charge pump circuit for generating $V_{BB}$. The threshold voltages of the transistors $Q_4$ and $Q_5$ are set to be equal to the threshold voltages of the transistors $Q_2$ and $Q_3$, and by setting the threshold voltage of the transistor $Q_6$ at $V_T$, the output from the circuit is finally attains to $V_{T2}+V_{T3}+V_T-V_C$, that is, $V_{BB}+V_T$. Since the threshold voltages must be set to $V_T \leq V_{T1}$ as described above, the threshold voltage of the transistor $Q_6$ must be set to be not higher than the threshold voltage $V_{T1}$ of the NMOSFET $Q_1$ of FIG. 1.

Figure 5:
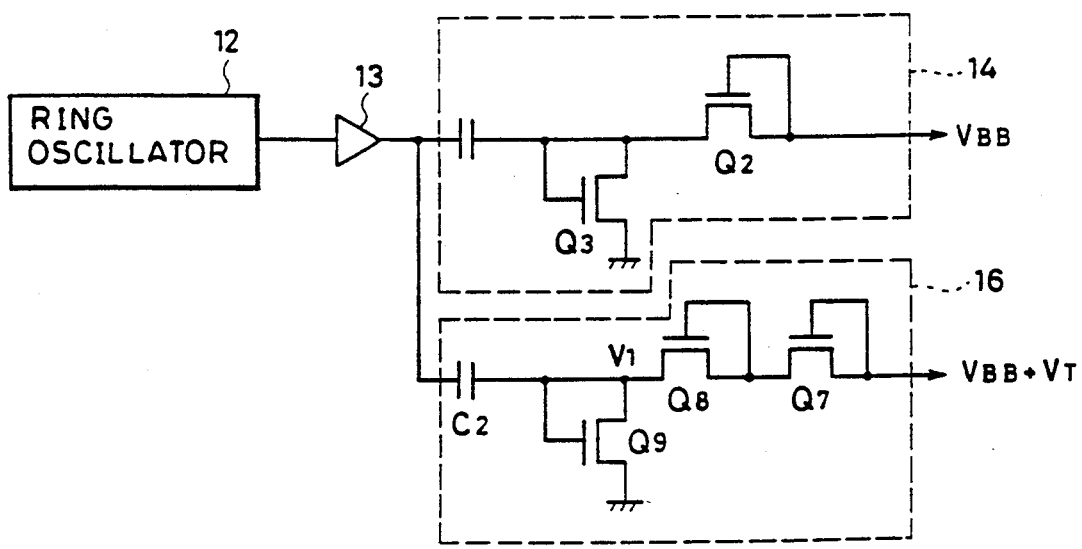
FIG. 5 is a diagram showing another example of the $(V_{BB}+V_D)$ generating circuit.

FIG. 5 shows another example of the $(V_{BB}+V_T)$ generating circuit. In FIG. 5, transistors $Q_7$ and $Q_8$ are connected in series between the capacitor $C_2$ and the output portion. By setting the threshold voltage of the transistors $Q_8$ and $Q_9$ to be equal to the threshold voltages $V_{T2}$ and $V_{T3}$ of the transistors $Q_2$ and $Q_3$, and by setting the threshold voltage of the transistor $Q_7$ at $V_T$, the same operation as above is carried out, and $V_{BB}+V_T$ is provided as an output.

Figure 6:
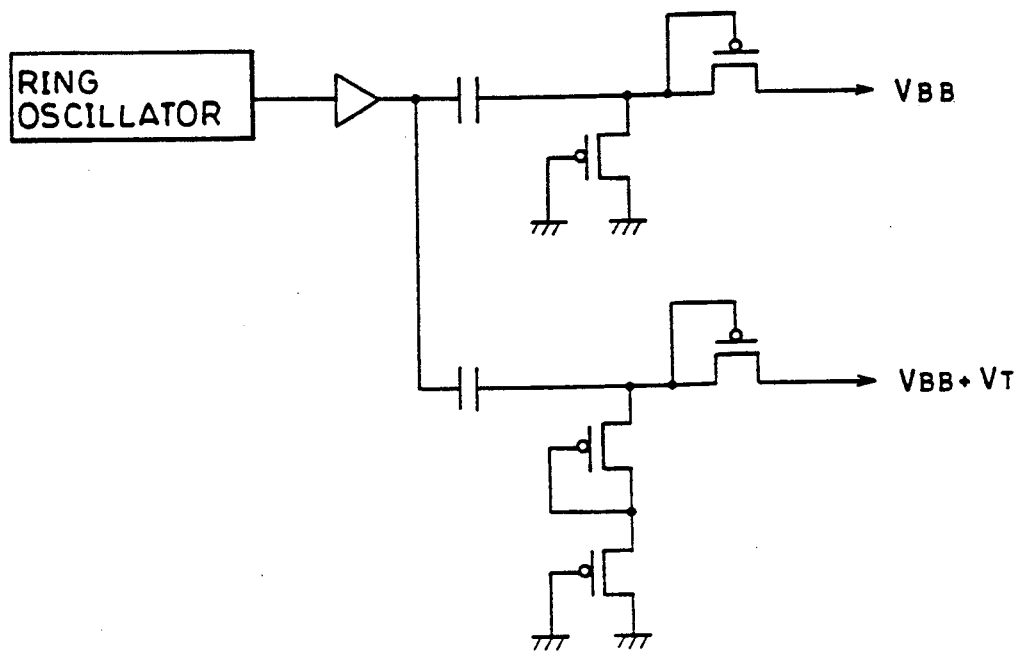
FIG. 6 shows a further embodiment of the $V_{BB}$ and the $(V_{BB}+V_D)$ generating circuit.

FIG. 6 shows another example of the charge pump circuit. In FIG. 6, the charge pump circuit is formed by a PMOSFET. In this case also, the operation of the circuit is the same as that described above.

Figure 7:
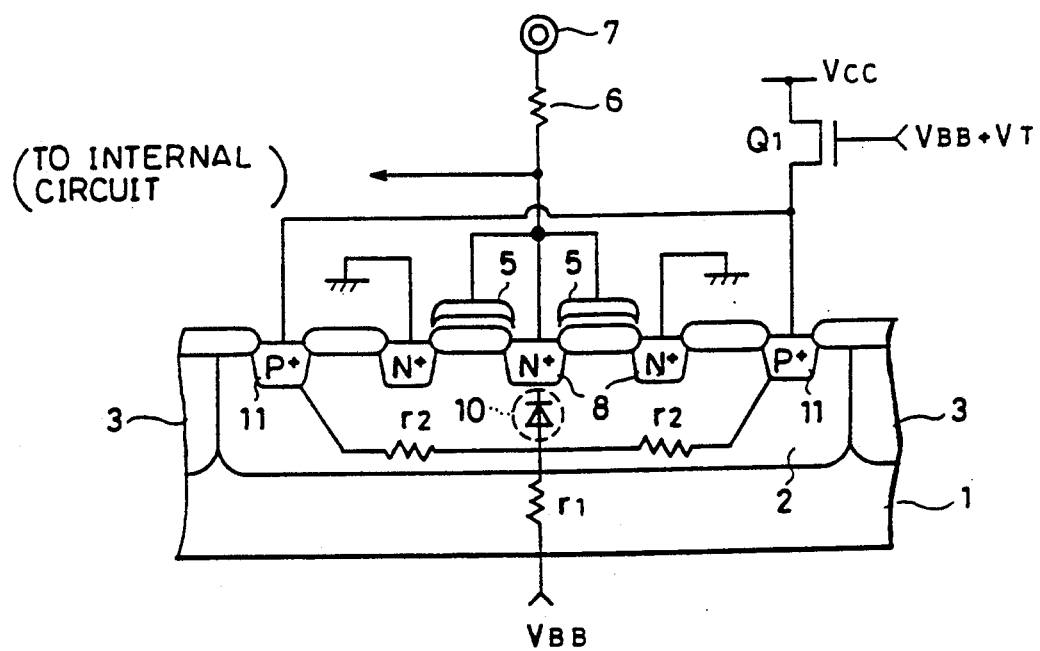
FIG. 7 is a schematic diagram showing another embodiment of the input circuit in accordance with the present invention.
Figure 8:
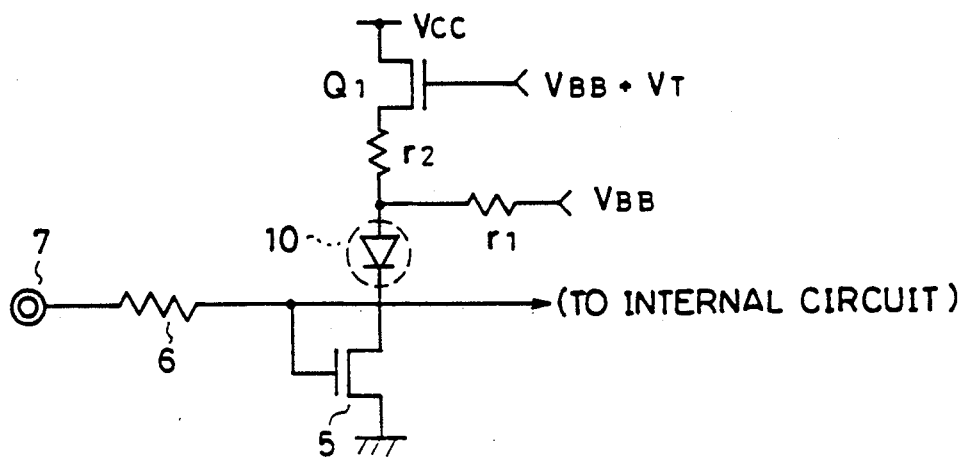
FIG. 8 is an equivalent circuit diagram of the input circuit shown in FIG. 7.

The input circuit in accordance with another embodiment of the present invention will be described with reference to FIG. 7. The input circuit of FIG. 7 is different from that of FIG. 1 in that the gate electrode of the NMOS transistor 5 is connected to the input side. The gate oxide film of the NMOS transistor 5 is very thick, and the threshold voltage thereof is very high, so that it is normally OFF. However, if a high electrostatic input pulse is applied to the input terminal 7 and a high voltage is applied to the N+ diffusion layer 8 and to the gate electrode of the NMOS transistor 5, the NMOS transistor 5 is turned on, and the high voltage is discharged to the ground potential. Consequently, gate breakdown or the like is not generated in the internal circuit. When an overshoot or an undershoot is applied as an input signal to the input terminal 7, the same operation as described in the above embodiments is carried out, to provide the same effect. The equivalent circuit of the input circuit shown in FIG. 7 is shown in FIG. 8.

In the above described embodiments (FIGS. 1 and 7), the drain of the NMOSFET $Q_1$ is connected to the supply voltage $V_{CC}$. This potential is to compensate for the potential of the P well 2 when it becomes lower than $V_{BB}$, so that it is not necessarily be $V_{CC}$. It should be at least not lower than $V_{BB}$.

Figure 9:
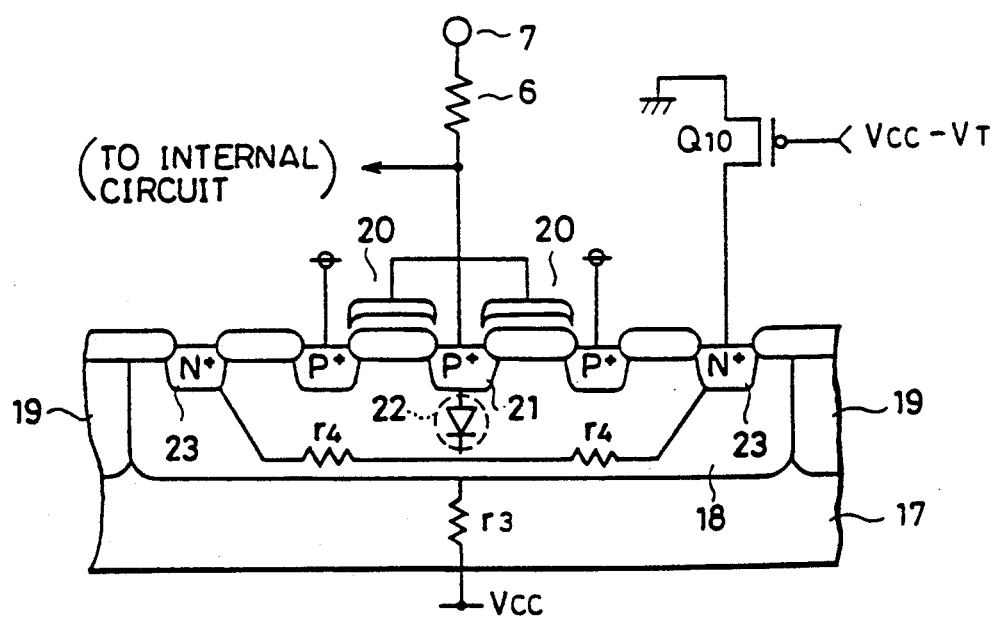
FIG. 9 is a schematic diagram showing a further embodiment of the input circuit in accordance with the present invention.
Figure 10:
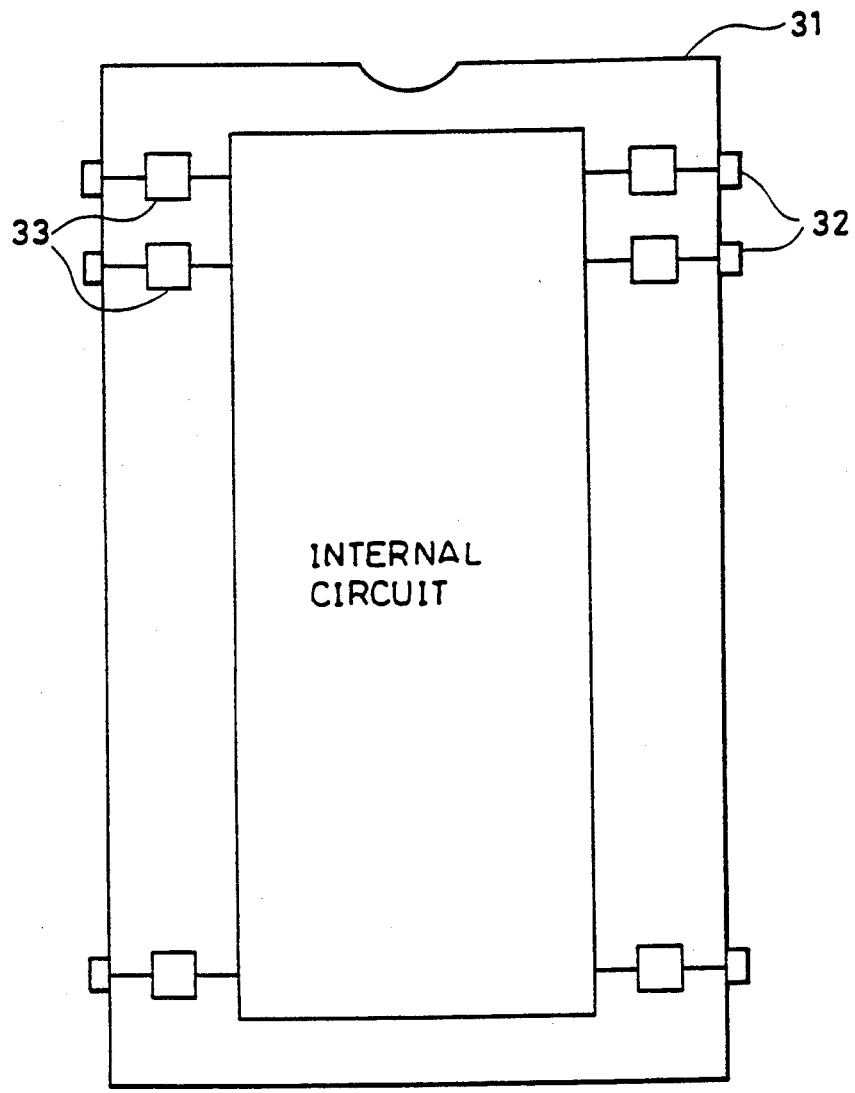
FIG. 10 is a block diagram showing a semiconductor integrated circuit device showing background of the invention.
Figure 13:
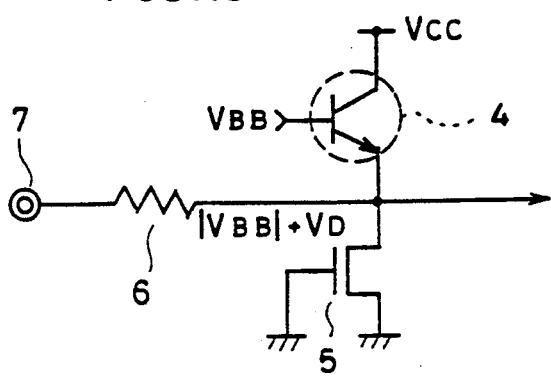
FIG. 13 is an equivalent circuit diagram of FIG. 12.
Figure 11:
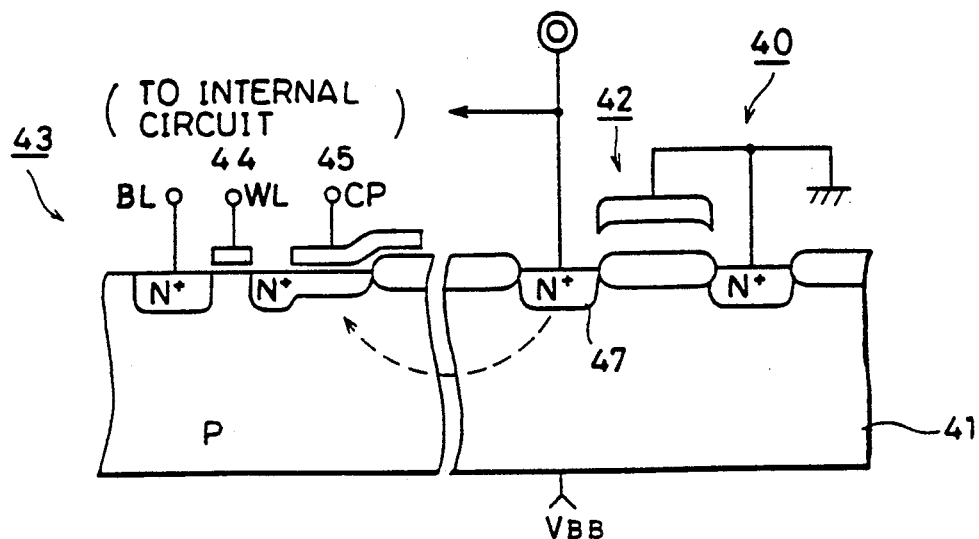
FIG. 11 illustrates a problem in consideration of which the present invention was made.

A further embodiment of the present invention will be described with reference to FIG. 9. The embodiment shown in FIG. 9 is different from the embodiment of FIG. 1 in that the polarity of the substrate 17, the well 18, the transistors 20 and $Q_{10}$ and so on are opposite to that of FIG. 1. Namely, in the embodiment of FIG. 9, the input circuit comprises a P+ diffusion layer 21 formed on a main surface of an N well 18 formed on the main surface of an N type semiconductor substrate 17, and an N+ diffusion layer 23. The input terminal 7 is connected to the P+ diffusion layer 21 and the PMOSFET $Q_{10}$ is connected to the N+ diffusion layer 23. In this case, the N type semiconductor substrate 17 is connected to the supply potential $V_{CC}$. The transistor 20 formed on the main surface of the substrate 17 is a PMOS transistor. The operation of the input circuit shown in FIG. 9 is the same as that of the input circuit shown in FIG. 1 except that the polarity is opposite, and the effects provided by the circuit are also the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input circuit of a semiconductor device, comprising:
   a semiconductor substrate of a first conductivity type having a main surface and connected to a first potential;
   a first region of said same first conductivity type as said substrate, said first region formed on the main surface of said semiconductor substrate;
   a first region of a second conductivity type different from said first conductivity type formed on said main surface in the first region of said first conductivity type, wherein a P-N junction is formed by said first region of the second conductivity type and said first region of the first conductivity type, an input voltage applied to said first region of said second conductivity type, said input voltage applied to an internal circuit formed on said semiconductor substrate; and current absorbing means connected to a second region of the first conductivity type formed on said main surface in said first region of the first conductivity type for absorbing, when said P-N junction is rendered conductive by an application of an excessive voltage to said input voltage, current generated by said excessive voltage to a second potential different from said first potential.

2. An input circuit of a semiconductor device, comprising:

a semiconductor substrate having a main surface;

a first region of a first conductivity type formed on the main surface of said semiconductor substrate;

a first region of a second conductivity type different from said first conductivity type formed on said main surface in the first region of said first conductivity type, wherein a P-N junction is formed by said first region of the second conductivity type and said first region of the first conductivity type, an input voltage applied to said first region of said second conductivity type, said input voltage applied to an internal circuit formed on said semiconductor substrate; and current absorbing means connected to a second region of the first conductivity type formed on said main surface in said first region of the first conductivity type for absorbing, when said P-N junction is rendered conductive by an application of an excessive voltage to said input voltage, current generated by excessive voltage, wherein said current absorbing means comprises a field effect element of said second conductivity type.

3. An input circuit of a semiconductor device according to claim 2, wherein said field effect element comprises a field effect transistor.

4. An input circuit of a semiconductor device according to claim 2, wherein said field effect element of the second conductivity type comprises an N type MOSFET, said N type MOSFET has a first terminal and a second terminal, said second terminal connected to said second region of said first conductivity type, a substrate potential is supplied by said semiconductor substrate, and said first terminal of said field effect transistor connected to a supply potential, and said N type MOSFET operates in response to a prescribed potential higher than said substrate potential.

5. An input circuit of a semiconductor device according to claim 2, wherein said field effect element of the second conductivity type comprises a P type MOSFET, said P type MOSFET has a first terminal and a second terminal, said second terminal connected to said second region of said first conductivity type, a substrate potential is supplied to said semiconductor substrate, said first terminal of said P type MOSFET is connected to a ground potential, and said MOSFET operates in response to a prescribed potential lower than said substrate potential.

6. An apparatus for controlling a substrate current in a semiconductor device for preventing undesirable current flow to said substrate caused by conduction of a P-N junction, wherein:

said substrate includes:
    a well,
    an impurity region in said well,
    said substrate and said well having a common conductivity type, and
    a parasitic P-N junction between said well and said impurity region in said well;

said substrate maintained at a first prescribed potential, comprising:

P-N junction conduction detecting means for detecting conduction of said parasitic P-N junction; and excessive current absorbing means for absorbing, when said conduction detecting means detects conduction, excessive current generated by conduction to a second prescribed potential different from said first prescribed potential.

7. An apparatus for controlling a substrate current in a semiconductor device having a P-N junction parasitically formed on a substrate, for preventing unpreferable current flow to said substrate caused by conduction of said P-N junction, said substrate maintained at a prescribed potential, comprising:

P-N junction conduction detecting means for detecting conduction of said P-N junction;

excessive current absorbing means for absorbing, when said conduction detecting means detects conduction, excessive current generated by conduction to a prescribed potential;

said semiconductor device including a first region of a first conductivity type formed on a main surface of said substrate and including said P-N junction, and a second region of the first conductivity type not constituting said P-N junction formed on the main surface of said semiconductor substrate between said excessive current absorbing means and said first region, wherein said P-N junction conduction detecting means detects conduction of said P-N junction by detecting a potential of the second region of said first conductivity type.

8. A substrate current controlling apparatus according to claim 7, further comprising switching means, absorbing said excessive current to said second prescribed potential by operating at a potential having a constant relation with said first prescribed potential.

9. In a semiconductor device having a parasitically formed P-N junction on a substrate, wherein said substrate includes:

a well, an impurity region in said well, said substrate and said well having a common conductivity type, and said parasitically formed P-N junction being between said well and said impurity region in said well, a method of controlling substrate current for preventing undesirable current flow to said substrate caused by conduction of the parasitically formed P-N junction, comprising the steps of:
maintaining said substrate at a first prescribed potential,
detecting conduction of said parasitically formed P-N junction; and
upon detection of said conduction, absorbing excessive current generated thereby to a second prescribed potential different from said first prescribed potential.

* * * * *